United States Patent
Brcka (10) Patent No.: US 7,651,570 B2
(45) Date of Patent: *Jan. 26, 2010

(54) SOLID PRECURSOR VAPORIZATION SYSTEM FOR USE IN CHEMICAL VAPOR DEPOSITION

(75) Inventor: Jozef Brcka, Londonville, NY (US)

(73) Assignee: Tokyo Electron Limited, Tokyo (JP)

( * ) Notice: Subject to any disclaimer, the term of this patent is extended or adjusted under 35 U.S.C. 154(b) by 154 days.

This patent is subject to a terminal disclaimer.

(21) Appl. No.: 11/096,077

(22) Filed: Mar. 31, 2005

(65) Prior Publication Data

US 2006/0219168 A1 Oct. 5, 2006

(51) Int. Cl.
*C23C 16/00* (2006.01)
*C23C 16/448* (2006.01)

(52) U.S. Cl. .................................................. 118/726
(58) Field of Classification Search .................. 118/726; 392/389
See application file for complete search history.

(56) References Cited

U.S. PATENT DOCUMENTS

| | | | |
|---|---|---|---|
| 3,003,249 A | 10/1961 | Templeton | |
| 3,801,294 A | 4/1974 | Schultz et al. | |
| 4,190,965 A | 3/1980 | Erickson | |
| 4,378,987 A * | 4/1983 | Miller et al. | 65/418 |
| 4,817,557 A * | 4/1989 | Diem et al. | 118/719 |
| 4,948,623 A | 8/1990 | Beach et al. | |
| 5,221,354 A | 6/1993 | Rigney | |
| 5,904,771 A * | 5/1999 | Tasaki et al. | 117/105 |
| 5,914,001 A | 6/1999 | Hansen | 156/345 |
| 6,024,915 A | 2/2000 | Kume et al. | |
| 6,113,982 A | 9/2000 | Claar et al. | |
| 6,203,619 B1 * | 3/2001 | McMillan | 118/719 |
| 6,270,839 B1 | 8/2001 | Onoe et al. | |
| 6,380,080 B2 | 4/2002 | Visokay | |
| 6,440,494 B1 * | 8/2002 | Arena-Foster | 427/250 |
| 6,544,345 B1 | 4/2003 | Mayer et al. | 134/28 |
| 6,718,126 B2 | 4/2004 | Lei | |
| 6,897,160 B2 | 5/2005 | Derderian | |
| 6,921,062 B2 | 7/2005 | Gregg et al. | |
| 7,122,085 B2 | 10/2006 | Shero et al. | |
| 7,132,128 B2 * | 11/2006 | Brcka | 427/248.1 |
| 7,273,814 B2 * | 9/2007 | Matsuda | 438/680 |
| 7,279,421 B2 * | 10/2007 | Suzuki | 438/680 |
| 7,566,477 B2 * | 7/2009 | Brcka | 427/248.1 |
| 2002/0013052 A1 | 1/2002 | Visokay | |
| 2002/0187632 A1 | 12/2002 | Marsh | |
| 2003/0019428 A1 * | 1/2003 | Ku et al. | 118/715 |
| 2003/0053799 A1 * | 3/2003 | Lei | 392/388 |
| 2003/0111014 A1 | 6/2003 | Donatucci et al. | |

(Continued)

FOREIGN PATENT DOCUMENTS

JP 05-098445 * 4/1993

(Continued)

OTHER PUBLICATIONS

U.S. Patent and Trademark Office, Office Action in related U.S. Appl. No. 10/998,420, dated Apr. 5, 2007, 7pp.

(Continued)

*Primary Examiner*—Jeffrie R Lund
(74) *Attorney, Agent, or Firm*—Wood, Herron & Evans, LLP (57) ABSTRACT

A solid precursor vaporization system configured for use in a deposition system, such as thermal chemical vapor deposition (TCVD), is described. The solid precursor vaporization system comprises a plurality of concentric solid precursor cylinders supported on a gas distribution plate and configured to provide a substantially constant surface area as solid precursor is consumed.

40 Claims, 5 Drawing Sheets

U.S. PATENT DOCUMENTS

| | | | |
|---|---|---|---|
| 2003/0203617 A1 | 10/2003 | Lane et al. | |
| 2003/0211736 A1 | 11/2003 | Ludviksson et al. | |
| 2004/0016404 A1* | 1/2004 | Gregg et al. | 118/726 |
| 2004/0025370 A1 | 2/2004 | Guenther | |
| 2004/0161545 A1* | 8/2004 | Montano et al. | 427/407.1 |
| 2004/0206935 A1 | 10/2004 | Miura et al. | |
| 2005/0006799 A1* | 1/2005 | Gregg et al. | 261/119.1 |
| 2005/0072357 A1* | 4/2005 | Shero et al. | 118/715 |
| 2005/0147749 A1* | 7/2005 | Liu et al. | 427/248.1 |
| 2006/0110530 A1* | 5/2006 | Suzuki et al. | 427/248.1 |
| 2006/0110918 A1* | 5/2006 | Suzuki | 438/674 |
| 2006/0115589 A1* | 6/2006 | Vukovic | 427/248.1 |
| 2006/0115590 A1 | 6/2006 | Suzuki et al. | |
| 2006/0115593 A1* | 6/2006 | Suzuki et al. | 427/248.1 |
| 2006/0182886 A1* | 8/2006 | Guidotti et al. | 427/252 |
| 2006/0211228 A1* | 9/2006 | Matsuda | 438/575 |
| 2006/0219168 A1* | 10/2006 | Brcka | 118/715 |
| 2006/0220248 A1 | 10/2006 | Suzuki | |
| 2006/0222769 A1* | 10/2006 | Brcka | 427/248.1 |
| 2007/0032079 A1* | 2/2007 | Suzuki et al. | 438/681 |
| 2007/0072414 A1 | 3/2007 | Suzuki | |
| 2007/0113789 A1* | 5/2007 | Brcka | 118/726 |
| 2007/0170604 A1* | 7/2007 | Soininen | 261/122.1 |
| 2007/0237895 A1* | 10/2007 | Suzuki et al. | 427/255.28 |
| 2008/0003360 A1* | 1/2008 | Suzuki et al. | 427/250 |
| 2008/0035062 A1* | 2/2008 | Suzuki | 118/728 |
| 2008/0241357 A1* | 10/2008 | Suzuki | 427/96.8 |

FOREIGN PATENT DOCUMENTS

| | | |
|---|---|---|
| JP | 06306584 | 11/1997 |
| WO | 2004/011695 | 7/2003 |
| WO | WO 2004/010463 A2 | 1/2004 |
| WO | 2006/058310 A1 | 6/2006 |

OTHER PUBLICATIONS

U.S. Patent and Trademark Office, Office Action in related U.S. Appl. No. 10/998,420, dated Sep. 26, 2007, 6 pp.

U.S. Patent and Trademark Office, Office Action in related U.S. Appl. No. 10/998,420, dated Dec. 6, 2007, 3 pp.

U.S. Patent and Trademark Office, Office Action in related U.S. Appl. No. 10/998,420, dated Mar. 13, 2008, 6 pp.

U.S. Patent and Trademark Office, Office Action in related U.S. Appl. No. 11/007,961, dated Mar. 6, 2008, 11 pp.

U.S. Patent and Trademark Office, Office Action in related U.S. Appl. No. 11/351,539, dated Sep. 11, 2007, 8 pp.

U.S. Patent and Trademark Office, Office Action in related U.S. Appl. No. 11/351,539, dated Apr. 5, 2007, 7 pp.

U.S. Patent and Trademark Office, Office Action in related U.S. Appl. No. 11/007,962, dated Jan. 9, 2008, 6pp.

U.S. Patent and Trademark Office, Office Action in related U.S. Appl. No. 11/007,962, dated May 3, 2007, 8 pp.

U.S. Patent and Trademark Office, Office Action in related U.S. Appl. No. 11/007,962, dated Dec. 4, 2006, 9 pp.

U.S. Patent and Trademark Office, Office Action in related U.S. Appl. No. 11/537,575, dated May 5, 2008, 10 pp.

European Patent Office, International Search Report and Written Opinion, May 4, 2006, 7 pp.

EPO, International Search Report and Written Opinion of the International Searching Authority, International Application No. PCT/US2007/060561, Mailed May 9, 2007, 9 pp.

U.S. Patent and Trademark Office, Office Action in related U.S. Appl. No. 11/007,962, dated Jun. 6, 2008, 11 pp.

Taiwanese IPO, Notice of Examination Opinions in related TW Application No. 94143637, dated Mar. 25, 2008, 12 pp.

U.S. Patent and Trademark Office, Office Action in related U.S. Appl. No. 10/998,420, dated Nov. 13, 2008, 7 pp.

U.S. Patent and Trademark Office, Office Action in related U.S. Appl. No. 10/998,420, dated Feb. 12, 2009, 22 pp.

Chinese IPO, Office Action in CN Appl. No. 200580040912.0, dated Mar. 23, 2009, 9 pp.

US Patent and Trademark Office, Office Action in U.S. Appl. No. 10/998,420, dated Jul. 9, 2009.

* cited by examiner

SOLID PRECURSOR VAPORIZATION SYSTEM FOR USE IN CHEMICAL VAPOR DEPOSITION

CROSS-REFERENCE TO RELATED APPLICATIONS

This application is related to U.S. patent application Ser. No. 11/007,961, now U.S. Pat. No. 7,488,512 issued Feb. 10, 2009, and entitled "Method for Preparing Solid Precursor Tray for Use in Solid Precursor Evaporation System", filed on Dec. 9, 2004, the content of which is herein incorporated by reference in its entirety.

BACKGROUND OF THE INVENTION

1. Field of the Invention

The present invention relates to a system for thin film deposition, and more particularly to a system for vaporizing a film precursor and delivering the vapor to a deposition chamber.

2. Description of Related Art

The introduction of copper (Cu) metal into multilayer metallization schemes for manufacturing integrated circuits can necessitate the use of diffusion barriers/liners to promote adhesion and growth of the Cu layers and to prevent diffusion of Cu into the dielectric materials. Barriers/liners that are deposited onto dielectric materials can include refractive materials, such as tungsten (W), molybdenum (Mo), and tantalum (Ta), that are non-reactive and immiscible in Cu, and can offer low electrical resistivity. Current integration schemes that integrate Cu metallization and dielectric materials can require barrier/liner deposition processes at substrate temperatures between about 400° C. and about 500° C., or lower.

For example, Cu integration schemes for technology nodes less than or equal to 130 nm currently utilize a low dielectric constant (low-k) inter-level dielectric, followed by a physical vapor deposition (PVD) TaN layer and Ta barrier layer, followed by a PVD Cu seed layer, and an electrochemical deposition (ECD) Cu fill. Generally, Ta layers are chosen for their adhesion properties (i.e., their ability to adhere on low-k films), and Ta/TaN layers are generally chosen for their barrier properties (i.e., their ability to prevent Cu diffusion into the low-k film).

As described above, significant effort has been devoted to the study and implementation of thin transition metal layers as Cu diffusion barriers, these studies including such materials as chromium, tantalum, molybdenum and tungsten. Each of these materials exhibits low miscibility in Cu. More recently, other materials, such as ruthenium (Ru) and rhodium (Rh), have been identified as potential barrier layers since they are expected to behave similarly to conventional refractory metals. However, the use of Ru or Rh can permit the use of only one barrier layer, as opposed to two layers, such as Ta/TaN. This observation is due to the adhesive and barrier properties of these materials. For example, one Ru layer can replace the Ta/TaN barrier layer. Moreover, current research is finding that the one Ru layer can further replace the Cu seed layer, and bulk Cu fill can proceed directly following Ru deposition. This observation is due to good adhesion between the Cu and the Ru layers.

Conventionally, Ru layers can be formed by thermally decomposing a ruthenium-containing precursor, such as a ruthenium carbonyl precursor, in a thermal chemical vapor deposition (TCVD) process. Material properties of Ru layers that are deposited by thermal decomposition of metal carbonyl precursors (e.g., $Ru_3(CO)_{12}$), can deteriorate when the substrate temperature is lowered to below about 400° C. As a result, an increase in the (electrical) resistivity of the Ru layers and poor surface morphology (e.g., the formation of nodules) at low deposition temperatures has been attributed to increased incorporation of CO reaction by-products into the thermally deposited Ru layers. Both effects can be explained by a reduced CO desorption rate from the thermal decomposition of the ruthenium carbonyl precursor at substrate temperatures below about 400° C.

Additionally, the use of metal carbonyls, such as ruthenium carbonyl, can lead to poor deposition rates due to their low vapor pressure, and the transport issues associated therewith. Overall, the inventor has observed that current deposition systems suffer from such a low rate, making the deposition of such metal films impractical.

SUMMARY OF THE INVENTION

The present invention provides a film precursor vaporization system configured to be coupled to a thin film deposition system comprising: a container comprising an outer wall and a bottom; a lid configured to be sealably coupled to the container, the lid comprising an outlet configured to be sealably coupled to the thin film deposition system; a gas distribution plate having one or more openings formed there-through, positioned in the container substantially near the bottom of the container to form a plenum with the outer wall and the bottom of the container, wherein the plenum is coupled to a carrier gas supply system configured to supply a carrier gas to the container; and one or more cylindrical solid precursor elements comprising a solid precursor supported by the gas distribution plate and positioned within the container to form one or more cylindrical spaces in general alignment with said one or more openings in said gas distribution plate through which the carrier gas can flow from the plenum to the outlet in the lid.

The present invention further provides a deposition system for forming a thin film on a substrate comprising: a process chamber having a substrate holder configured to support the substrate and heat the substrate, a vapor distribution system coupled to the process chamber and configured to introduce film precursor vapor above the substrate, a pumping system configured to evacuate the process chamber; and the film precursor vaporization system described above having its outlet coupled to the vapor distribution system.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
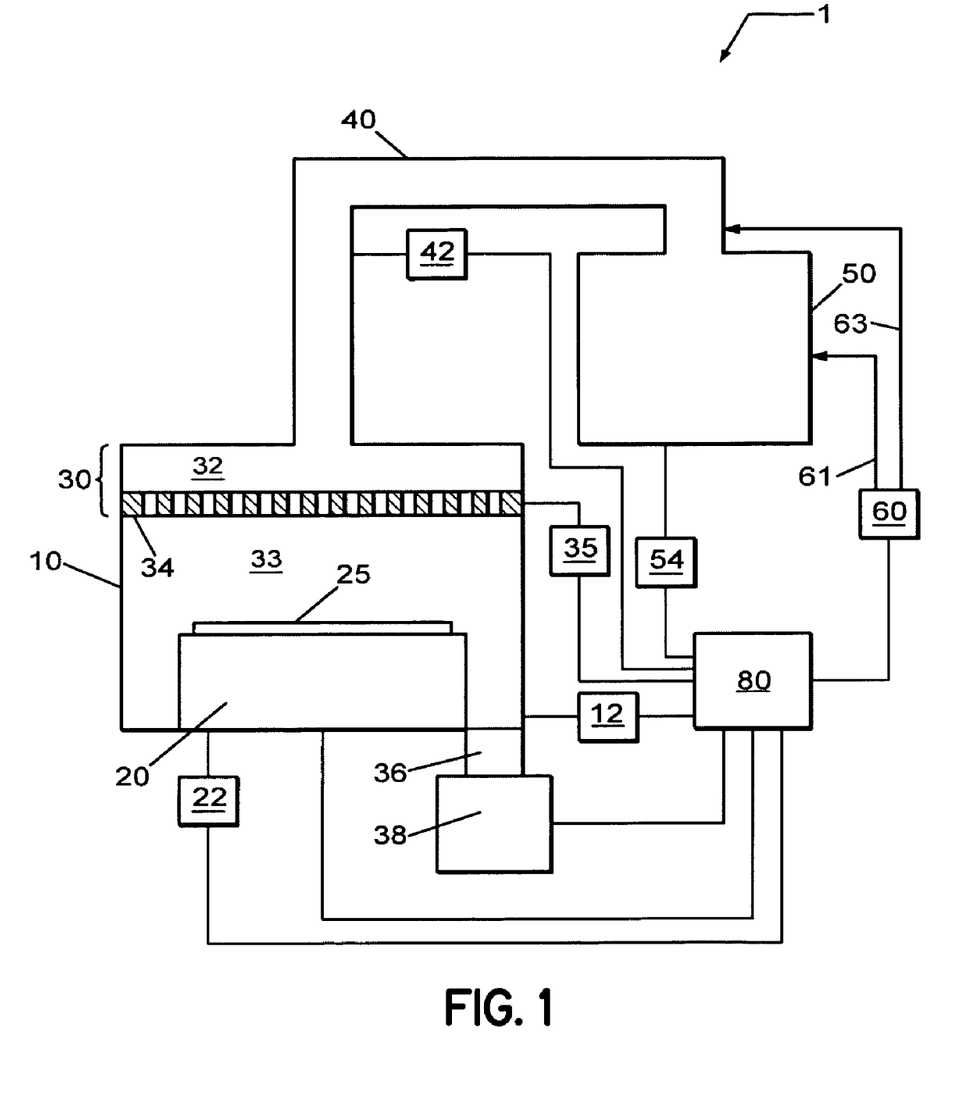
FIG. 1 depicts a schematic view of a deposition system according to an embodiment of the invention.

Referring now to the drawings, wherein like reference numerals designate identical or corresponding parts throughout the several views, FIG. 1 illustrates a deposition system 1 for depositing a thin film, such as a ruthenium (Ru) or a rhenium (Re) metal film, on a substrate according to one embodiment. The deposition system 1 comprises a process chamber 10 having a substrate holder 20 configured to support a substrate 25, upon which the thin film is formed. The process chamber 10 is coupled to a film precursor vaporization system 50 via a vapor precursor delivery system 40.

The process chamber 10 is further coupled to a vacuum pumping system 38 through a duct 36, wherein the pumping system 38 is configured to evacuate the process chamber 10, vapor precursor delivery system 40, and film precursor vaporization system 50 to a pressure suitable for forming the thin film on substrate 25, and suitable for vaporization of a film precursor (not shown) in the film precursor vaporization system 50.

Referring still to FIG. 1, the film precursor vaporization system 50 is configured to store a film precursor and heat the film precursor to a temperature sufficient for vaporizing the film precursor, while introducing vapor phase film precursor to the vapor precursor delivery system 40. As will be discussed in more detail below with reference to FIGS. 3-4, the film precursor can, for example, comprise a solid film precursor. Additionally, for example, the film precursor can include a solid metal precursor. Additionally, for example, the film precursor can include a metal carbonyl. For instance, the metal carbonyl can include ruthenium carbonyl ($Ru_3(CO)_{12}$), or rhenium carbonyl ($Re_2(CO)_{10}$). Additionally, for instance, the metal carbonyl can include $W(CO)_6$, $Mo(CO)_6$, $Co_2(CO)_8$, $Rh_4(CO)_{12}$, $Cr(CO)_6$, or $Os_3(CO)_{12}$.

In order to achieve the desired temperature for evaporating the film precursor (or subliming a solid metal precursor), the film precursor vaporization system 50 is coupled to a vaporization temperature control system 54 configured to control the vaporization temperature. For instance, the temperature of the film precursor is generally elevated to approximately 40-45° C. in conventional systems in order to sublime, for example, ruthenium carbonyl. At this temperature, the vapor pressure of the ruthenium carbonyl, for instance, ranges from approximately 1 to approximately 3 mTorr. As the film precursor is heated to cause evaporation (or sublimation), a carrier gas is passed over the film precursor or by the film precursor. The carrier gas can include, for example, an inert gas, such as a noble gas (i.e., He, Ne, Ar, Kr, Xe), or a monoxide, such as carbon monoxide (CO), for use with metal carbonyls, or a mixture thereof. For example, a carrier gas supply system 60 is coupled to the film precursor vaporization system 50, and it is configured to, for instance, supply the carrier gas above the film precursor via feed line 61. In another example, carrier gas supply system 60 is coupled to the vapor precursor delivery system 40 and is configured to supply the carrier gas to the vapor of the film precursor via feed line 63 as or after it enters the vapor precursor delivery system 40. Although not shown, the carrier gas supply system 60 can comprise a gas source, one or more control valves, one or more filters, and a mass flow controller. For instance, the flow rate of carrier gas can range from approximately 5 sccm (standard cubic centimeters per minute) to approximately 1000 sccm. For example, the flow rate of carrier gas can range from about 10 sccm to about 200 sccm. By way of further example, the flow rate of carrier gas can range from about 20 sccm to about 100 sccm.

Downstream from the film precursor vaporization system 50, the film precursor vapor flows with the carrier gas through the vapor precursor delivery system 40 until it enters a vapor distribution system 30 coupled to the process chamber 10. The vapor precursor delivery system 40 can be coupled to a vapor line temperature control system 42 in order to control the vapor line temperature, and prevent decomposition of the film precursor vapor as well as condensation of the film precursor vapor. For example, the vapor line temperature can be set to a value approximately equal to or greater than the vaporization temperature. Additionally, for example, the vapor precursor delivery system 40 can be characterized by a high conductance in excess of about 50 liters/second.

Referring again to FIG. 1, the vapor distribution system 30, coupled to the process chamber 10, comprises a plenum 32 within which the vapor disperses prior to passing through a vapor distribution plate 34 and entering a processing zone 33 above substrate 25. In addition, the vapor distribution plate 34 can be coupled to a distribution plate temperature control system 35 configured to control the temperature of the vapor distribution plate 34. For example, the temperature of the vapor distribution plate can be set to a value approximately equal to the vapor line temperature. However, it may be less, or it may be greater.

Once film precursor vapor enters the processing zone 33, the film precursor vapor thermally decomposes upon adsorption at the substrate surface due to the elevated temperature of the substrate 25, and the thin film is formed on the substrate 25. The substrate holder 20 is configured to elevate the temperature of substrate 25, by virtue of the substrate holder 20 being coupled to a substrate temperature control system 22. For example, the substrate temperature control system 22 can be configured to elevate the temperature of substrate 25 up to approximately 500° C. In one embodiment, the substrate temperature can range from about 100° C. to about 500° C. In another embodiment, the substrate temperature can range from about 300° C. to about 400° C. Additionally, process chamber 10 can be coupled to a chamber temperature control system 12 configured to control the temperature of the chamber walls.

As described above, for example, conventional systems have contemplated operating the film precursor vaporization system 50, as well as the vapor precursor delivery system 40, within a temperature range of approximately 40-45° C. for ruthenium carbonyl in order to limit metal vapor precursor decomposition, and metal vapor precursor condensation. For example, ruthenium carbonyl precursor can decompose at elevated temperatures to form by-products, such as those illustrated below:

$$Ru_3(CO)_{12}{}^*(ad) \Leftrightarrow Ru_3(CO)_x{}^*(ad)+(12-x)CO(g) \quad (1)$$

or, $$Ru_3(CO)_x{}^*(ad) \Leftrightarrow 3Ru(s)+xCO(g) \quad (2)$$

wherein these by-products can adsorb, i.e., condense, on the interior surfaces of the deposition system 1. The accumulation of material on these surfaces can cause problems from one substrate to the next, such as process repeatability. Alternatively, for example, ruthenium carbonyl precursor can condense at depressed temperatures to cause recrystallization, viz.

$$Ru_3(CO)_{12}(g) \Leftrightarrow Ru_3(CO)_{12}{}^*(ad) \quad (3)$$

However, within such systems having a small process window, the deposition rate becomes extremely low, due in part to the low vapor pressure of ruthenium carbonyl. For instance, the deposition rate can be as low as approximately 1 Angstrom per minute. Therefore, according to one embodiment, the vaporization temperature is elevated to be greater than or equal to approximately 40° C. Alternatively, the vaporization temperature is elevated to be greater than or equal to approximately 50° C. In an exemplary embodiment of the present invention, the vaporization temperature is elevated to be greater than or equal to approximately 60° C. In a further exemplary embodiment, the vaporization temperature is elevated to range from approximately 60-100° C., and for example from approximately 60-90° C. The elevated temperature increases the vaporization rate due to the higher vapor pressure (e.g., nearly an order of magnitude larger) and, hence, it is expected by the inventors to increase the deposition rate. It may also be desirable to periodically clean deposition system 1 following processing of one or more substrates. For example, additional details on a cleaning method and system can be obtained from co-pending U.S. patent application Ser. No. 10/998,394, filed on Nov. 29, 2004, and entitled "Method and System for Performing In-situ Cleaning of a Deposition System", which is herein incorporated by reference in its entirety.

As discussed above, the deposition rate is proportional to the amount of film precursor that is vaporized and transported to the substrate prior to decomposition, or condensation, or both. Therefore, in order to achieve a desired deposition rate, and to maintain consistent processing performance (i.e., deposition rate, film thickness, film uniformity, film morphology, etc.) from one substrate to the next, it is important to provide the ability to monitor, adjust, or control the flow rate of the film precursor vapor. In conventional systems, an operator may indirectly determine the flow rate of film precursor vapor by using the vaporization temperature, and a pre-determined relationship between the vaporization temperature and the flow rate. However, processes and their performance drift in time, and hence it is imperative that the flow rate is measured more accurately. For example, additional details can be obtained from co-pending U.S. patent application Ser. No. 10/998,393, filed on Nov. 29, 2004, and entitled "Method and System for Measuring a Flow Rate in a Solid Precursor Delivery System", which is herein incorporated by reference in its entirety.

Still referring the FIG. 1, the deposition system 1 can further include a control system 80 configured to operate, and control the operation of the deposition system 1. The control system 80 is coupled to the process chamber 10, the substrate holder 20, the substrate temperature control system 22, the chamber temperature control system 12, the vapor distribution system 30, the vapor precursor delivery system 40, the film precursor vaporization system 50, and the carrier gas supply system 60.

Figure 2:
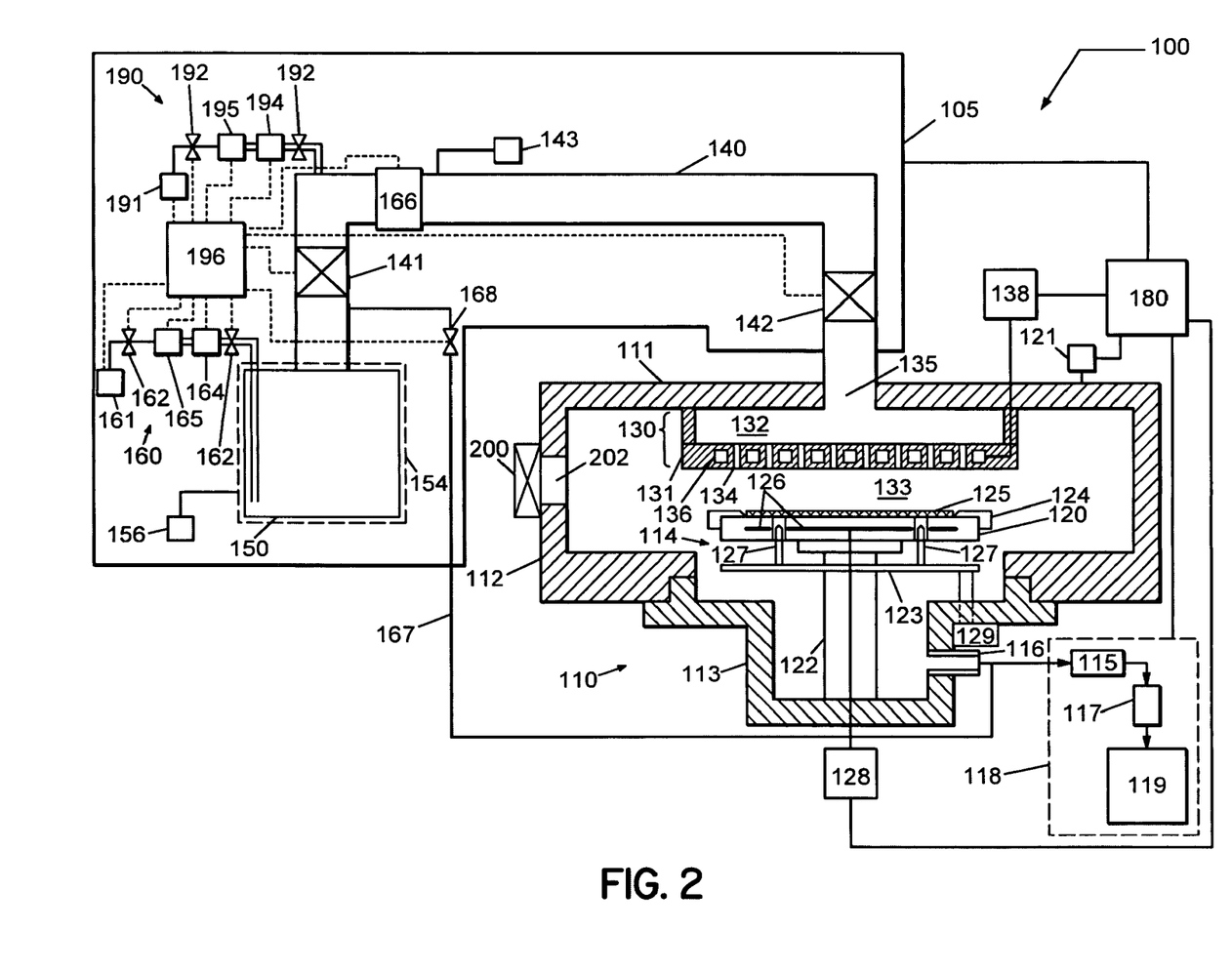
FIG. 2 depicts a schematic view of a deposition system according to another embodiment of the invention.

In yet another embodiment, FIG. 2 illustrates a deposition system 100 for depositing a thin film, such as a ruthenium (Ru) or a rhenium (Re) metal film, on a substrate. The deposition system 100 comprises a process chamber having a substrate holder 120 configured to support a substrate 125, upon which the thin film is formed. The process chamber 110 is coupled to a precursor delivery system 105 having film precursor vaporization system 150 configured to store and vaporize a film precursor (not shown), and a vapor precursor delivery system 140 configured to transport film precursor vapor.

The process chamber 110 comprises an upper chamber section 111, a lower chamber section 112, and an exhaust chamber 113. An opening 114 is formed within lower chamber section 112, where bottom section 112 couples with exhaust chamber 113.

Referring still to FIG. 2, substrate holder 120 provides a horizontal surface to support substrate (or wafer) 125, which is to be processed. The substrate holder 120 can be supported by a cylindrical support member 122, which extends upward from the lower portion of exhaust chamber 113. An optional guide ring 124 for positioning the substrate 125 on the substrate holder 120 is provided on the edge of substrate holder 120. Furthermore, the substrate holder 120 comprises a heater 126 coupled to substrate holder temperature control system 128. The heater 126 can, for example, include one or more resistive heating elements. Alternately, the heater 126 can, for example, include a radiant heating system, such as a tungsten-halogen lamp. The substrate holder temperature control system 128 can include a power source for providing power to the one or more heating elements, one or more temperature sensors for measuring the substrate temperature, or the substrate holder temperature, or both, and a controller configured to perform at least one of monitoring, adjusting, or controlling the temperature of the substrate or substrate holder.

During processing, the heated substrate 125 can thermally decompose the vapor of film precursor vapor, such as a metal carbonyl precursor, and enable deposition of a thin film, such as a metal layer, on the substrate 125. According to one embodiment, the film precursor includes a solid precursor. According to another embodiment, the film precursor includes a metal precursor. According to another embodiment, the film precursor includes a solid metal precursor. According to yet another embodiment, the film precursor includes a metal carbonyl precursor. According to yet another embodiment, the film precursor can be a ruthenium carbonyl precursor, for example $Ru_3(CO)_{12}$. According to yet another embodiment of the invention, the film precursor can be a rhenium carbonyl precursor, for example $Re_2(CO)_{10}$. As will be appreciated by those skilled in the art of thermal chemical vapor deposition, other ruthenium carbonyl precursors and rhenium carbonyl precursors can be used without departing from the scope of the invention. In yet another embodiment, the film precursor can be $W(CO)_6$, $Mo(CO)_6$, $Co_2(CO)_8$, $Rh_4(CO)_{12}$, $Cr(CO)_6$, or $Os_3(CO)_{12}$. The substrate holder 120 is heated to a pre-determined temperature that is suitable for depositing, for instance, a desired Ru, Re, or other metal layer onto the substrate 125. Additionally, a heater (not shown), coupled to a chamber temperature control system 121, can be embedded in the walls of process chamber 110 to heat the chamber walls to a pre-determined temperature. The heater can maintain the temperature of the walls of process chamber 110 from about 40° C. to about 100° C., for example from about 40° C. to about 80° C. A pressure gauge (not shown) is used to measure the process chamber pressure.

Also shown in FIG. 2, a vapor distribution system 130 is coupled to the upper chamber section 111 of process chamber 110. Vapor distribution system 130 comprises a vapor distribution plate 131 configured to introduce precursor vapor from vapor distribution plenum 132 to a processing zone 133 above substrate 125 through one or more orifices 134.

Furthermore, an opening 135 is provided in the upper chamber section 111 for introducing a vapor precursor from vapor precursor delivery system 140 into vapor distribution plenum 132. Moreover, temperature control elements 136, such as concentric fluid channels configured to flow a cooled or heated fluid, are provided for controlling the temperature of the vapor distribution system 130, and thereby prevent the decomposition of the film precursor inside the vapor distribution system 130. For instance, a fluid, such as water, can be supplied to the fluid channels from a vapor distribution temperature control system 138. The vapor distribution temperature control system 138 can include a fluid source, a heat exchanger, one or more temperature sensors for measuring the fluid temperature or vapor distribution plate temperature or both, and a controller configured to control the temperature of the vapor distribution plate 131 from about 20° C. to about 100° C.

Film precursor vaporization system 150 is configured to hold a film precursor, and evaporate (or sublime) the film precursor by elevating the temperature of the film precursor. The terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas. A precursor heater 154 is provided for heating the film precursor to maintain the film precursor at a temperature that produces a desired vapor pressure of film precursor. The precursor heater 154 is coupled to a vaporization temperature control system 156 configured to control the temperature of the film precursor. For example, the precursor heater 154 can be configured to adjust the temperature of the film precursor (or vaporization temperature) to be greater than or equal to approximately 40° C. Alternatively, the vaporization temperature is elevated to be greater than or equal to approximately 50° C. For example, the vaporization temperature is elevated to be greater than or equal to approximately 60° C. In one embodiment, the vaporization temperature is elevated to range from approximately 60-100° C., and in another embodiment, to range from approximately 60-90° C.

As the film precursor is heated to cause evaporation (or sublimation), a carrier gas can be passed over the film precursor, or by the film precursor. The carrier gas can include, for example, an inert gas, such as a noble gas (i.e., He, Ne, Ar, Kr, Xe), or a monoxide, such as carbon monoxide (CO), for use with metal carbonyls, or a mixture thereof. For example, a carrier gas supply system 160 is coupled to the film precursor vaporization system 150, and it is configured to, for instance, supply the carrier gas above the film precursor. Although not shown in FIG. 2, carrier gas supply system 160 can also be coupled to the vapor precursor delivery system 140 to supply the carrier gas to the vapor of the film precursor as or after it enters the vapor precursor delivery system 140. The carrier gas supply system 160 can comprise a gas source 161, one or more control valves 162, one or more filters 164, and a mass flow controller 165. For instance, the flow rate of carrier gas can range from approximately 5 sccm (standard cubic centimeters per minute) to approximately 1000 sccm. In one embodiment, for instance, the flow rate of carrier gas can range from about 10 sccm to about 200 sccm. In another embodiment, for instance, the flow rate of carrier gas can range from about 20 sccm to about 100 sccm.

Additionally, a sensor 166 is provided for measuring the total gas flow from the film precursor vaporization system 150. The sensor 166 can, for example, comprise a mass flow controller, and the amount of film precursor delivered to the process chamber 110, can be determined using sensor 166 and mass flow controller 165. Alternately, the sensor 166 can comprise a light absorption sensor to measure the concentration of the film precursor in the gas flow to the process chamber 110.

A bypass line 167 can be located downstream from sensor 166, and it can connect the vapor delivery system 140 to an exhaust line 116. Bypass line 167 is provided for evacuating the vapor precursor delivery system 140, and for stabilizing the supply of the film precursor to the process chamber 110. In addition, a bypass valve 168, located downstream from the branching of the vapor precursor delivery system 140, is provided on bypass line 167.

Referring still to FIG. 2, the vapor precursor delivery system 140 comprises a high conductance vapor line having first and second valves 141 and 142 respectively. Additionally, the vapor precursor delivery system 140 can further comprise a vapor line temperature control system 143 configured to heat the vapor precursor delivery system 140 via heaters (not shown). The temperatures of the vapor lines can be controlled to avoid condensation of the film precursor in the vapor line. The temperature of the vapor lines can be controlled from about 20° C. to about 100° C., or from about 40° C. to about 90° C. For example, the vapor line temperature can be set to a value approximately equal to or greater than the vaporization temperature.

Moreover, dilution gases can be supplied from a dilution gas supply system 190. The dilution gas can include, for example, an inert gas, such as a noble gas (i.e., He, Ne, Ar, Kr, Xe), or a monoxide, such as carbon monoxide (CO), for use with metal carbonyls, or a mixture thereof. For example, the dilution gas supply system 190 is coupled to the vapor precursor delivery system 140, and it is configured to, for instance, supply the dilution gas to vapor film precursor. The dilution gas supply system 190 can comprise a gas source 191, one or more control valves 192, one or more filters 194, and a mass flow controller 195. For instance, the flow rate of carrier gas can range from approximately 5 sccm (standard cubic centimeters per minute) to approximately 1000 sccm.

Mass flow controllers 165 and 195, and valves 162, 192, 168, 141, and 142 are controlled by controller 196, which controls the supply, shutoff, and the flow of the carrier gas, the film precursor vapor, and the dilution gas. Sensor 166 is also connected to controller 196 and, based on output of the sensor 166, controller 196 can control the carrier gas flow through mass flow controller 165 to obtain the desired film precursor flow to the process chamber 110.

As illustrated in FIG. 2, the exhaust line 116 connects exhaust chamber 113 to pumping system 118. A vacuum pump 119 is used to evacuate process chamber 110 to the desired degree of vacuum, and to remove gaseous species from the process chamber 110 during processing. An automatic pressure controller (APC) 115 and a trap 117 can be used in series with the vacuum pump 119. The vacuum pump 119 can include a turbo-molecular pump (TMP) capable of a pumping speed up to 5000 liters per second (and greater). Alternately, the vacuum pump 119 can include a dry roughing pump. During processing, the carrier gas, dilution gas, or film precursor vapor, or any combination thereof, can be introduced into the process chamber 110, and the chamber pressure can be adjusted by the APC 115. For example, the chamber pressure can range from approximately 1 mTorr to approximately 500 mTorr, and in a further example, the chamber pressure can range from about 5 mTorr to 50 mTorr. The APC 115 can comprise a butterfly-type valve, or a gate valve. The trap 117 can collect unreacted precursor material, and by-products from the process chamber 110.

Referring back to the substrate holder 120 in the process chamber 110, as shown in FIG. 2, three substrate lift pins 127 (only two are shown) are provided for holding, raising, and lowering the substrate 125. The substrate lift pins 127 are coupled to plate 123, and can be lowered to below the upper surface of substrate holder 120. A drive mechanism 129 utilizing, for example, an air cylinder, provides means for raising and lowering the plate 123. Substrate 125 can be transferred into and out of process chamber 110 through gate valve 200, and chamber feed-through passage 202 via a robotic transfer system (not shown), and received by the substrate lift pins 127. Once the substrate 125 is received from the transfer system, it can be lowered to the upper surface of the substrate holder 120 by lowering the substrate lift pins 127.

Referring again to FIG. 2, a controller 180 includes a microprocessor, a memory, and a digital I/O port capable of generating control voltages sufficient to communicate and activate inputs of the processing system 100 as well as monitor outputs from the processing system 100. Moreover, the processing system controller 180 is coupled to and exchanges information with process chamber 110; precursor delivery system 105, which includes controller 196, vapor line temperature control system 142, and vaporization temperature control system 156; vapor distribution temperature control system 138; vacuum pumping system 118; and substrate holder temperature control system 128. In the vacuum pumping system 118, the controller 180 is coupled to and exchanges information with the automatic pressure controller 115 for controlling the pressure in the process chamber 110. A program stored in the memory is utilized to control the aforementioned components of deposition system 100 according to a stored process recipe. One example of processing system controller 180 is a DELL PRECISION WORKSTATION 610™, available from Dell Corporation, Dallas, Tex. The controller 180 may also be implemented as a general-purpose computer, digital signal process, etc.

Controller 180 may be locally located relative to the deposition system 100, or it may be remotely located relative to the deposition system 100 via an internet or intranet. Thus, controller 180 can exchange data with the deposition system 100 using at least one of a direct connection, an intranet, or the internet. Controller 180 may be coupled to an intranet at a customer site (i.e., a device maker, etc.), or coupled to an intranet at a vendor site (i.e., an equipment manufacturer). Furthermore, another computer (i.e., controller, server, etc.) can access controller 180 to exchange data via at least one of a direct connection, an intranet, or the internet.

Figure 3:
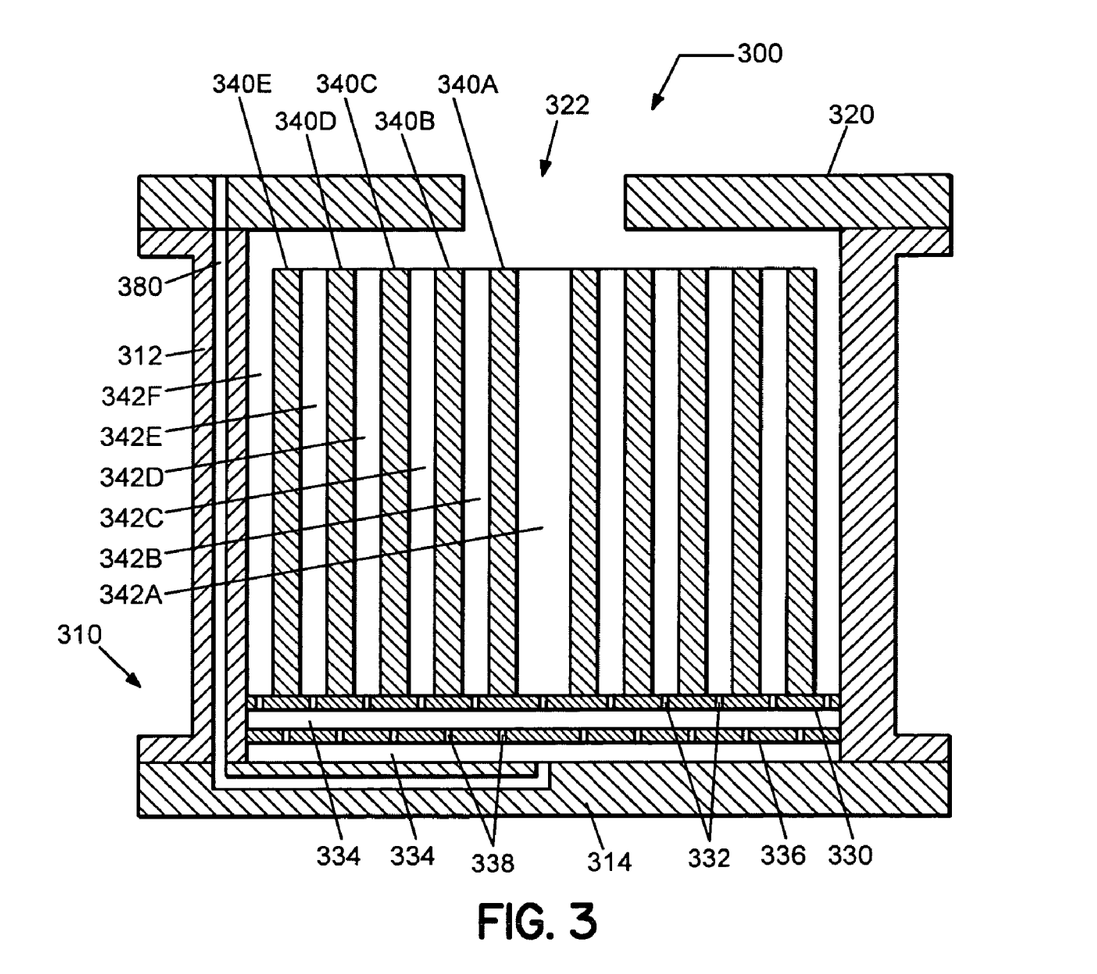
FIG. 3 presents in cross-sectional view a film precursor vaporization system according to an embodiment of the invention.

Referring now to FIG. 3, a film precursor vaporization system 300 is depicted in cross-sectional view according to an embodiment. The film precursor vaporization system 300 comprises a container 310 having an outer wall 312 and a bottom 314. Additionally, the film precursor vaporization system 300 comprises a lid 320 configured to be sealably coupled to the container 310, wherein the lid 320 includes an outlet 322 configured to be sealably coupled to a thin film deposition system, such as the one depicted in FIG. 1 or 2. The container 310 and lid 320 form a sealed environment when coupled to the thin film deposition system. The container 310 and lid 320 can, for example, be fabricated from A6061 aluminum, and may or may not include a coating applied thereon. Additionally, container 310 and lid 320 can, for example, be cylindrical in shape. By way of further example, the outer wall 312 can have an inner diameter of approximately 10-100 cm, such as approximately 20-40 cm.

Furthermore, the container 310 is configured to be coupled to a heater (not shown) in order to elevate the vaporization temperature of the film precursor vaporization system 300, and to a temperature control system (not shown) in order to perform at least one of monitoring, adjusting, or controlling the vaporization temperature. In one embodiment, the heater is at least one resistive heater element coupled to the container 310. When the vaporization temperature is elevated to an appropriate value as described earlier, film precursor evaporates (or sublimes) forming film precursor vapor to be transported through the vapor delivery system to the thin film deposition system. The container 310 is also sealably coupled to a carrier gas supply system (not shown), wherein container 310 is configured to receive a carrier gas for transporting the film precursor vapor.

Referring still to FIG. 3, the film precursor vaporization system 300 further comprises a gas distribution plate 330 positioned substantially near the bottom 314 of the container 310. The gas distribution plate 330 comprises one or more openings 332 configured to permit the flow of the carrier gas there-through from a plenum 334 formed between the gas distribution plate 330 and the bottom 314 of container 310. Optionally, the plenum 334 houses one or more baffle plates 336 having one or more openings 338 configured to distribute the carrier gas throughout the plenum 334. Additionally, the gas distribution plate 330 is configured to support one or more cylindrical (tubular) solid precursor elements 340A-E. The one or more cylindrical solid precursor elements 340A-E are arranged concentrically within container 310, and are positioned to provide one or more cylindrical spaces 342A-F through which the carrier gas may flow. Although five (5) cylindrical solid precursor elements 340A-E are shown in FIG. 3, there may be more or less. Additionally, centering features (not shown) may be utilized to generally align each of the one or more cylindrical solid precursor elements 340A-E within container 310.

The one or more openings 332 formed in the gas distribution plate 330 are generally aligned with the one or more cylindrical spaces 342A-F such that carrier gas from the carrier gas supply system (not shown) passes from the plenum 334 through the one or more openings 332, flows along the one or more cylindrical spaces 342A-F, and exits the container 310 through the outlet 322 in lid 320. The one or more openings 332 in the gas distribution plate 330 can comprise one or more arrays of circular orifices, or one or more arrays of elongated slots, or a combination thereof.

Each cylindrical solid precursor element 340A-E comprises a cylindrical (tubular) body having a mean radius (R), a wall thickness (r) and a height (h), an inner surface located at a first radius (R−r/2), and an outer surface located at a second radius (R+r/2). Excluding the ends, the initial surface area of each cylindrical body is $4\pi Rh$. When the inner surface and the outer surface recede uniformly at the same rate during consumption of the solid precursor, the evolving surface area of each cylindrical body remains constant. Since the flux of film precursor out of the vaporization system is directly proportional to the exposed surface area of solid precursor, then by maintaining a constant surface area in time, a constant flux of film precursor over time can be achieved. Alternately, for example, the cross-sectional geometry of each solid precursor element can be varied in order to affect the amount of exposed surface area as a function of time.

According to an embodiment, each cylindrical solid precursor element 340A-E comprises a metal precursor. According to another embodiment, the solid precursor includes a solid metal precursor. According to yet another embodiment, the solid precursor includes a metal carbonyl precursor. According to yet another embodiment, the solid precursor can be a ruthenium carbonyl precursor, for example $Ru_3(CO)_{12}$. According to yet another embodiment, the solid precursor can be a rhenium carbonyl precursor, for example $Re_2(CO)_{10}$. In yet another embodiment, the solid precursor can be $W(CO)_6$, $Mo(CO)_6$, $Co_2(CO)_8$, $Rh_4(CO)_{12}$, $Cr(CO)_6$, or $Os_3(CO)_{12}$.

For example, the one or more cylindrical solid precursor elements 340A-E can be prepared by a number of processes, including a sintering process, a stamping process, a dipping process, or a spin-on process, or any combination thereof. For example, a refractory metal powder may be sintered in a sintering furnace configured for either vacuum or inert gas atmospheres and temperatures up to 2000° C. and 2500° C. Alternatively, for example, a refractory metal powder can be dispersed in a fluid medium, dispensed on a cylindrical body, e.g., a cylindrical sheet, a porous cylindrical sheet or a cylindrical mesh, and distributed evenly over the body surfaces using a spin coating process or a dipping process. The refractory metal spin coat or dip coat may then be thermally cured.

As described earlier, carrier gas is supplied to the container 310 from a carrier gas supply system (not shown). As shown in FIG. 3, the carrier gas may be coupled to the container 310 through the lid 320 via a gas supply line (not shown) sealably coupled to the lid 320. The gas supply line feeds a gas channel 380 that extends downward through the outer wall 312 of container 310, passes through the bottom 314 of container 310 and opens to the plenum 334.

Figure 4:
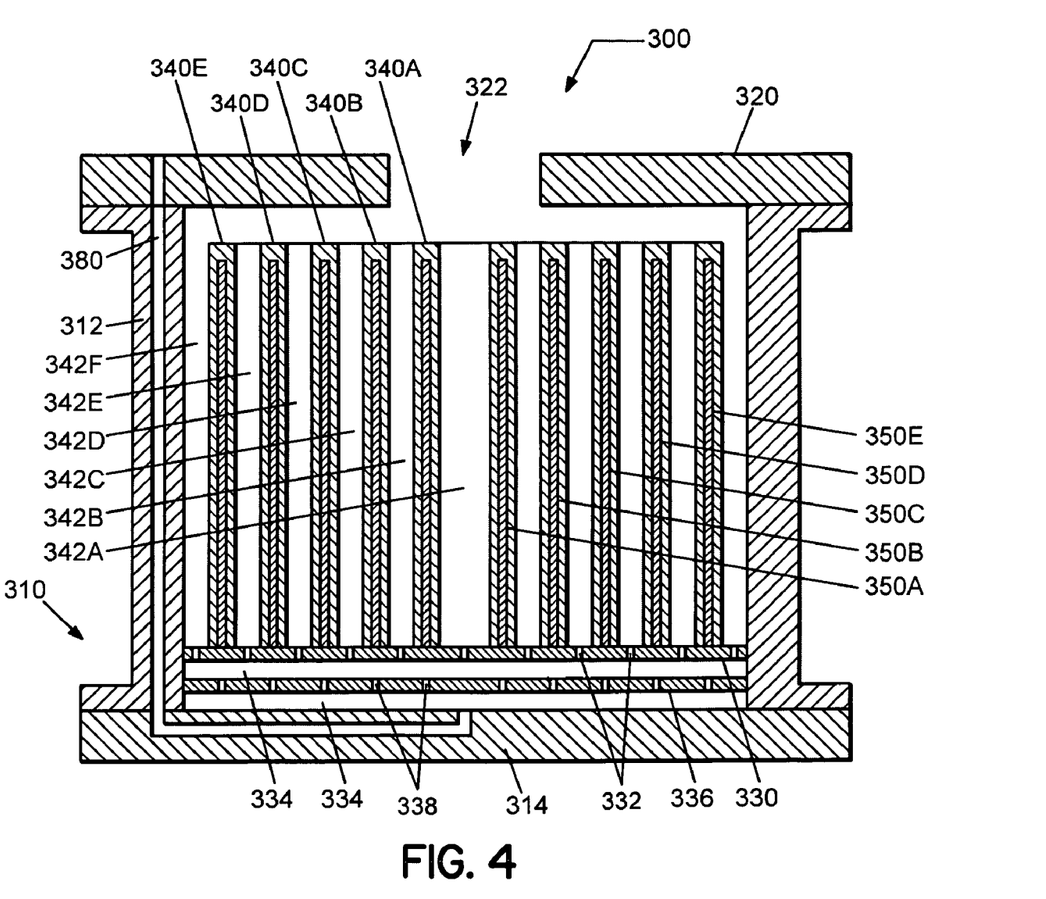
FIG. 4 presents in cross-sectional view a film precursor vaporization system according to another embodiment of the invention.

Referring now to FIG. 4, a film precursor vaporization system 300' is depicted in cross-sectional view according to another embodiment. In order to control the temperature of each cylindrical solid precursor element 340A-E, one or more temperature control elements 350A-E, also referred to herein as heater elements, are embedded therein. For instance, the temperature control/heater elements 350A-E can comprise a resistive heating element such as a tungsten, nickel-chromium alloy, aluminum-iron alloy, aluminum nitride, etc., filament. Examples of commercially available materials to fabricate resistive heating elements include Kanthal®, Nikrothal®, and Alkrothal®, which are registered trademark names for metal alloys produced by Kanthal Corporation of Bethel, Conn. The Kanthal® family includes ferritic alloys (FeCrAl) and the Nikrothal® family includes austenitic alloys (NiCr, NiCrFe). When an electrical current flows through the filament, power is dissipated as heat. Hence, the use of a temperature control unit coupled to the temperature control/heater element can maintain, adjust or control the temperature of the cylindrical solid precursor element and thus control a rate of sublimation of the solid precursor. In one example, the temperature control unit can include a controllable DC power supply coupled to one or more embedded Firerod® cartridge heaters commercially available from Watlow (1310 Kingsland Dr., Batavia, Ill., 60510).

The film precursor vaporization system 300 or 300' may be used as either film precursor vaporization system 50 in FIG. 1, or film precursor vaporization system 150 in FIG. 2. Alternatively, system 300 or 300' may be used in any film deposition system suitable for depositing a thin film on a substrate from precursor vapor.

Figure 5:
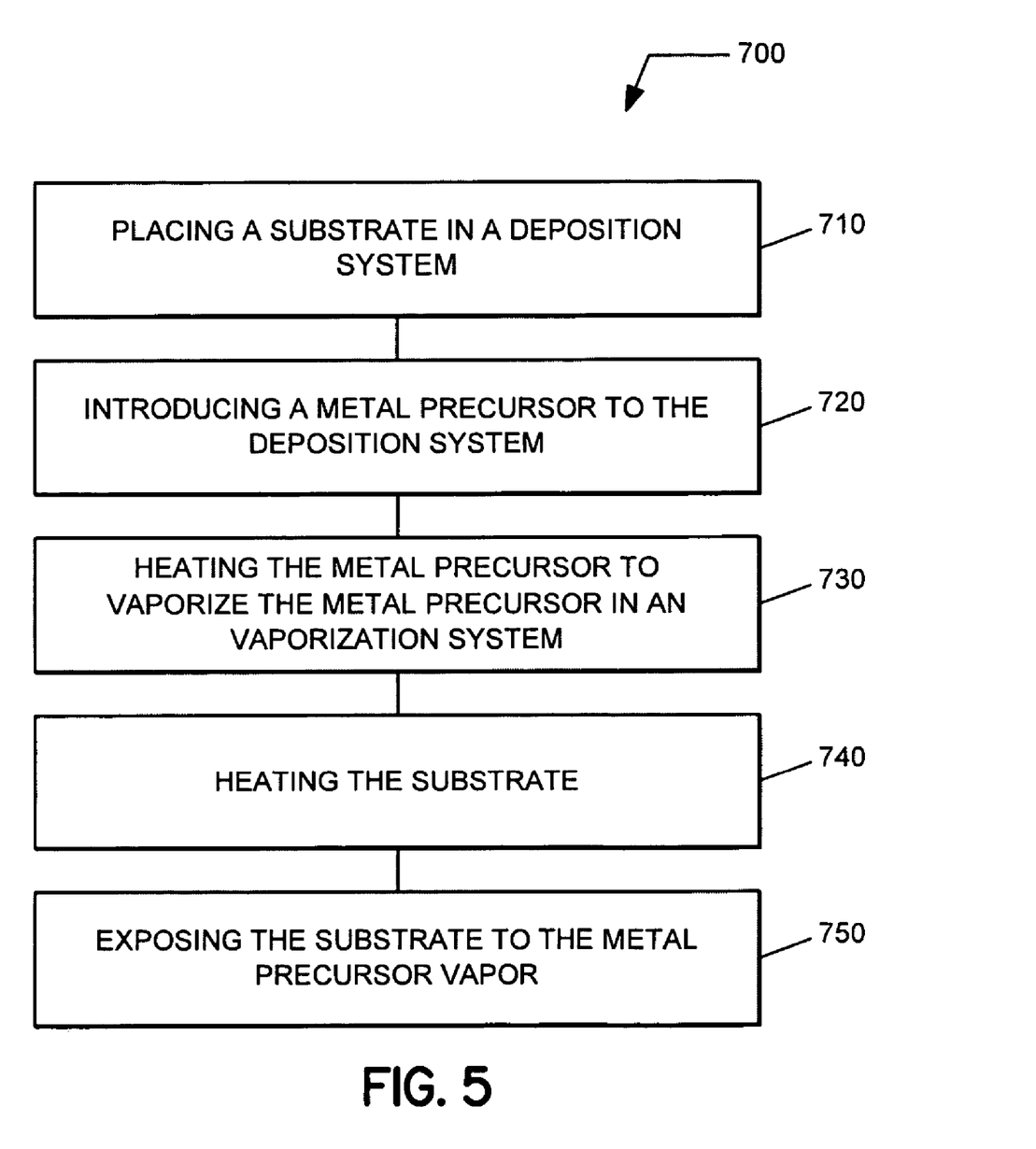
FIG. 5 illustrates a method of operating a film precursor vaporization system of the invention.

Referring now to FIG. 5, a method of depositing a thin film on a substrate is described. A flow chart 700 is used to illustrate the steps in depositing the thin film in a deposition system of the present invention. The thin film deposition begins in 710 with placing a substrate in the deposition system for forming the thin film on the substrate. For example, the deposition system can include any one of the depositions systems described above in FIGS. 1 and 2. The deposition system can include a process chamber for facilitating the deposition process, and a substrate holder coupled to the process chamber and configured to support the substrate. Then, in 720, a film precursor is introduced to the deposition system. For instance, the film precursor is introduced to a film precursor vaporization system coupled to the process chamber via a precursor vapor delivery system. Additionally, for instance, the precursor vapor delivery system can be heated.

In 730, the film precursor is heated to form a film precursor vapor. The film precursor vapor can then be transported to the process chamber through the precursor vapor delivery system. In 740, the substrate is heated to a substrate temperature sufficient to decompose the film precursor vapor, and, in 750, the substrate is exposed to the film precursor vapor. Steps 710 to 750 may be repeated successively a desired number of times to deposit a metal film on a desired number of substrates.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A film precursor vaporization system configured to be coupled to a thin film deposition system comprising:
   a container comprising an outer wall and a bottom;
   a lid configured to be sealably coupled to said container, said lid comprising an outlet configured to be sealably coupled to said thin film deposition system;
   a gas distribution plate having a plurality of openings formed there-through, positioned in said container substantially near said bottom of said container to form a plenum with said outer wall and said bottom of said container, wherein said plenum is coupled to a carrier gas supply system configured to supply a carrier gas to said container; and
   two or more hollow cylindrical solid precursor elements, each element including a cylindrical body having an inner cylindrical surface and an outer cylindrical surface, comprising a solid precursor supported by said gas distribution plate, and positioned concentrically to each other within said container to form cylindrical spaces between and surrounding said two or more hollow cylindrical solid precursor elements, wherein said cylindrical spaces are in general alignment with said plurality of openings in said gas distribution plate through which said carrier gas can flow from said plenum concurrently through said cylindrical spaces to said outlet in said lid,
   wherein a first direction of flow of said carrier gas from said plenum concurrently through a first cylindrical space is limited to a direction that is (i) substantially parallel to a longitudinal axis of said two or more hollow cylindrical solid precursor elements while being (ii) between and substantially parallel to both said inner cylindrical surface of a first hollow cylindrical solid precursor element and said outer cylindrical surface of a second hollow cylindrical solid precursor element, and
   wherein said film precursor vaporization system is configured to heat said solid precursor to a vaporization temperature to form a film precursor vapor and to transport said film precursor vapor in said carrier gas through said outlet to the thin film deposition system.

2. The film precursor vaporization system of claim 1, wherein said two or more hollow cylindrical solid precursor elements comprise a solid metal precursor.

3. The film precursor vaporization system of claim 1, wherein said two or more hollow cylindrical solid precursor elements comprise a solid metal carbonyl precursor.

4. The film precursor vaporization system of claim 3, wherein said solid metal carbonyl precursor includes $W(CO)_6$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$.

5. The film precursor vaporization system of claim 1, wherein said two or more hollow cylindrical solid precursor elements are formed by performing one or more of a sintering process, a stamping process, a dipping process, a spin-on process, or a combination thereof.

6. The film precursor vaporization system of claim 1, wherein said two or more hollow cylindrical solid precursor elements are formed by performing a sintering process in a vacuum atmosphere or in an inert atmosphere.

7. The film precursor vaporization system of claim 1, wherein said two or more hollow cylindrical solid precursor elements are formed by performing a dipping process by dissolving said solid precursor in solid powder form into a solvent bath, and dipping a coating substrate into said solvent bath.

8. The film precursor vaporization system of claim 7, wherein said performing said dipping process further comprises baking said coating substrate following said dipping of said coating substrate.

9. The film precursor vaporization system of claim 7, wherein said dipping said coating substrate includes dipping a cylindrical sheet.

10. The film precursor vaporization system of claim 7, wherein said dipping said coating substrate includes dipping a porous cylindrical sheet.

11. The film precursor vaporization system of claim 7, wherein said dipping said coating substrate includes dipping a cylindrical mesh.

12. The film precursor vaporization system of claim 1, wherein said container comprises a cylindrical shape.

13. The film precursor vaporization system of claim 12, wherein an inner diameter of said outer wall of said container ranges from approximately 10 cm to approximately 100 cm.

14. The film precursor vaporization system of claim 12, wherein an inner diameter of said outer wall of said container ranges from approximately 20 cm to 40 cm.

15. The film precursor vaporization system of claim 1, wherein said plurality of openings includes a plurality of elongated slots.

16. The film precursor vaporization system of claim 1, wherein said plurality of openings includes a plurality of circular orifices.

17. The film precursor vaporization system of claim 1, further comprising a gas channel extending from said lid through said outer wall of said container to said bottom of said container, and coupled to said plenum.

18. The film precursor vaporization system of claim 17, wherein said carrier gas supply system is sealably coupled through said lid to said gas channel in said outer wall of said container whereby said plenum is coupled to said carrier gas supply system.

19. The film precursor vaporization system of claim 1, further comprising a heater for heating said solid precursor, said heater coupled to said container and comprising at least one resistive heater element.

20. The film precursor vaporization system of claim 1, wherein said two or more hollow cylindrical solid precursor elements further comprise a resistive heater element embedded in said solid precursor for heating said solid precursor, and coupled to a temperature control unit configured to control the temperature of said two or more hollow cylindrical solid precursor elements.

21. The film precursor vaporization system of claim 1, further comprising a heater element coupled to one or more of said two or more hollow cylindrical solid precursor elements for heating said solid precursor.

22. The film precursor vaporization system of claim 21, wherein said heater element comprises at least one resistive heater element.

23. The film precursor vaporization system of claim 21, further comprising a temperature control unit coupled to said heater element and configured to maintain said two or more hollow cylindrical solid precursor elements at an elevated temperature greater than or equal to about 40° C.

24. The film precursor vaporization system of claim 1, wherein a total surface area of said inner cylindrical surface and said outer cylindrical surface of each hollow cylindrical solid precursor element remains substantially constant during the consumption of each of said two or more hollow cylindrical solid precursor elements.

25. The film precursor vaporization system of claim 1 wherein said first hollow cylindrical solid precursor element has a first mean radius and said second hollow cylindrical solid precursor element has a second mean radius, and wherein said first mean radius is greater than said second mean radius such that said first hollow cylindrical solid precursor element surrounds said second hollow cylindrical solid precursor element with said inner cylindrical surface of said first hollow cylindrical solid precursor element spaced apart from said outer cylindrical surface of said second hollow cylindrical solid precursor element by said first cylindrical space.

26. The film precursor vaporization system of claim 25 wherein said outer surface of said first hollow cylindrical solid precursor element or said inner cylindrical surface of said second hollow cylindrical solid precursor element define a second cylindrical space and a second direction of flow of said carrier gas, wherein said second direction of flow of said carrier gas is substantially parallel to said first direction of flow of said carrier gas.

27. The film precursor vaporization system of claim 26 wherein said first cylindrical space is configured to flow a first portion of carrier gas and said second cylindrical space is configured to flow a second portion of carrier gas, and said first portion of carrier gas does not flow through said second cylindrical space after flowing through said first cylindrical space and said second portion of carrier gas does not flow through said first cylindrical space after flowing through said second cylindrical space.

28. The film precursor vaporization system of claim 1 wherein said two or more hollow cylindrical solid precursor elements comprise a sintered refractory metal powder.

29. A thin film deposition system for forming a thin film on a substrate comprising:
a process chamber having a substrate holder configured to support said substrate and heat said substrate, a vapor distribution system coupled to said process chamber and configured to introduce film precursor vapor above said substrate, and a pumping system configured to evacuate said process chamber; and
the film precursor vaporization system of claim 1, wherein said outlet is coupled to said vapor distribution system.

30. A deposition system for forming a thin film on a substrate comprising:
a process chamber having a substrate holder configured to support said substrate and heat said substrate;
a vapor distribution system coupled to said process chamber and configured to introduce film precursor vapor above said substrate;
a pumping system configured to evacuate said process chamber;
a film precursor vaporization system configured to vaporize a film precursor, and to transport said film precursor vapor in a carrier gas, wherein said film precursor vaporization system comprises:
a container comprising an outer wall and a bottom;
a lid sealably coupled to said container, said lid comprising an outlet sealably coupled to said vapor distribution system;

a gas distribution plate having a plurality of openings formed there-through, positioned in said container substantially near said bottom of said container to form a plenum with said outer wall and said bottom of said container;

a gas channel extending from said lid through said outer wall of said container to said bottom of said container, and coupled to said plenum;

two or more hollow cylindrical solid precursor elements, each element including a cylindrical body having an inner cylindrical surface and an outer cylindrical surface, comprising a solid precursor supported by said gas distribution plate, and positioned concentrically to each other within said container to form cylindrical spaces between and surrounding said two or more hollow cylindrical solid precursor elements, wherein said cylindrical spaces are in general alignment with said plurality of openings in said gas distribution plate; and at least one heater element coupled to at least one of said container or one of said two or more hollow cylindrical solid precursor elements, wherein said heater element is configured to heat one of said two or more hollow cylindrical solid precursor elements to a vaporization temperature to form said film precursor vapor; and a carrier gas supply system sealably coupled through said lid to said gas channel and configured to supply said carrier gas through said gas channel to said plenum and through said plurality of openings and concurrently through said cylindrical spaces to said outlet in said lid for transporting said film precursor vapor to said process chamber, wherein a direction of flow of said carrier gas from said plenum concurrently through a first cylindrical space is limited to a direction that is (i) substantially parallel to a longitudinal axis of said two or more hollow cylindrical solid precursor elements while being (ii) between and substantially parallel to both said inner cylindrical surface of a first hollow cylindrical solid precursor element and said outer cylindrical surface of a second hollow cylindrical solid precursor element.

31. The deposition system of claim 30, wherein said solid precursor is a solid metal precursor.

32. The deposition system of claim 30, wherein said solid precursor comprises a solid metal carbonyl precursor.

33. The deposition system of claim 32, wherein said solid metal carbonyl precursor includes $W(CO)_6$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$.

34. The deposition system of claim 30, wherein each of said two or more hollow cylindrical solid precursor elements comprises a respective one of said at least one heater element embedded in said solid precursor.

35. A film precursor vaporization system configured to be coupled to a thin film deposition system comprising:

a container comprising an inner wall, an outer wall, and a bottom;

a lid configured to be sealably coupled to said container, said lid comprising an outlet configured to be sealably coupled to said thin film deposition system;

a gas distribution plate having a plurality of openings formed there-through, positioned in said container substantially near said bottom of said container to form a plenum with said outer wall and said bottom of said container, wherein said plenum is coupled to a carrier gas supply system configured to supply a carrier gas to said container; and two or more hollow cylindrical solid precursor elements comprising a solid precursor supported by said gas distribution plate and positioned concentrically to each other within said container to form cylindrical spaces between and surrounding said two or more hollow cylindrical solid precursor elements, wherein each of said plurality of openings in said gas distribution plate is in general alignment with one of said cylindrical spaces, wherein a portion of carrier gas can flow through each of said plurality of openings into said one respective generally aligned cylindrical space and does not flow through another of said cylindrical spaces, wherein a direction of flow of said carrier gas from said plenum is concurrent through said cylindrical spaces and is limited to a direction that is substantially parallel to a longitudinal axis of said two or more hollow cylindrical solid precursor elements, and wherein said film precursor vaporization system is configured to heat said solid precursor to a vaporization temperature to form a film precursor vapor and to transport said film precursor vapor in said carrier gas through said outlet to the thin film deposition system.

36. A film precursor vaporization system configured to be coupled to a thin film deposition system comprising:

a container comprising an outer wall and a bottom;

a lid configured to be sealably coupled to said container, said lid comprising an outlet configured to be sealably coupled to said thin film deposition system;

a gas distribution plate having a plurality of openings formed there-through, positioned in said container substantially near said bottom of said container to form a plenum with said outer wall and said bottom of said container, wherein said plenum is coupled to a carrier gas supply system configured to supply a carrier gas to said container; and two or more hollow cylindrical elements each comprising a solid precursor and each having a different mean radius, wherein the two or more hollow cylindrical elements are positioned concentrically within each other and spaced apart from each other on said gas distribution plate within said container to form a nested arrangement with cylindrical spaces between and surrounding said two or more hollow cylindrical elements, wherein said cylindrical spaces are in general alignment with said plurality of openings in said gas distribution plate through which said carrier gas can flow from said plenum concurrently through said cylindrical spaces in contact with said solid precursor and to said outlet in said lid, and wherein said film precursor vaporization system is configured to heat said solid precursor to a vaporization temperature to form a film precursor vapor and to transport said film precursor vapor in said carrier gas through said outlet to the thin film deposition system.

37. The film precursor vaporization system of claim 36, wherein said two or more hollow cylindrical elements comprise a solid metal carbonyl precursor.

38. The film precursor vaporization system of claim 37, wherein said solid metal carbonyl precursor includes $W(CO)_6$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$.

39. The film precursor vaporization system of claim 36, wherein said two or more hollow cylindrical elements are formed by performing a sintering process, a stamping process, a dipping process, or a spin-on process, or a combination thereof.

40. The film precursor vaporization system of claim 36, wherein said two or more hollow cylindrical elements are formed by performing a dipping process by dissolving said solid precursor in solid powder form into a solvent bath, and dipping a coating substrate into said solvent bath.

* * * * *